March 17, 1959 J. R. A. BEALE 2,878,147

METHOD OF MAKING SEMI-CONDUCTIVE DEVICE

Filed April 2, 1957

2,878,147
Patented Mar. 17, 1959

2,878,147

METHOD OF MAKING SEMI-CONDUCTIVE DEVICE

Julian Robert Anthony Beale, Wraysbury, near Staines, England

Application April 2, 1957, Serial No. 650,227
Claims priority, application Great Britain April 3, 1956
6 Claims. (Cl. 148—1.5)

This invention relates to a method of making a semi-conductive device in particular, it relates to a method of making a semi-conductive device comprising a junction between two regions of different conductivity types, with the region of the first conductivity type and the junction standing out from the adjacent level of the region of the second conductivity type, and with a solder contact covering entirely that part of the surface of the region of first conductivity type which is substantially parallel to the junction.

In accordance with the invention, the method comprises the steps of diffusing an impurity for providing a region of the first conductivity type through the surface of a crystal of the second conductivity type to provide a depth of material of the first conductivity type over the whole or a desired surface of the crystal, and providing a solder contact to the region of the first conductivity type. Thereafter, the crystal is etched with an etchant which substantially does not affect the solder such that the region of the first conductivity type and the junction between the regions of first and second conductivity types stands out from the adjacent level of the region of the second conductivity type.

Prior to the step of etching, part of the surface of the crystal may be removed to a depth exceeding the depth of the junction by mechanical means and an ohmic contact secured to the crystal for providing contact to the region of second conductivity type.

Figure 1:
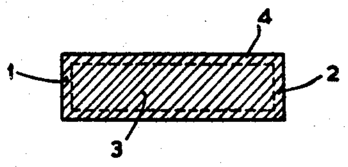
Figure 2:
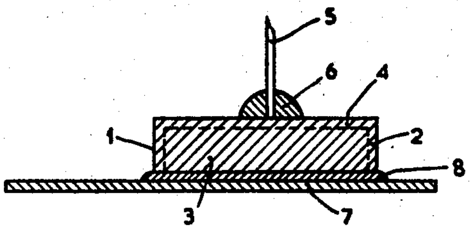
Figures 3, 4:
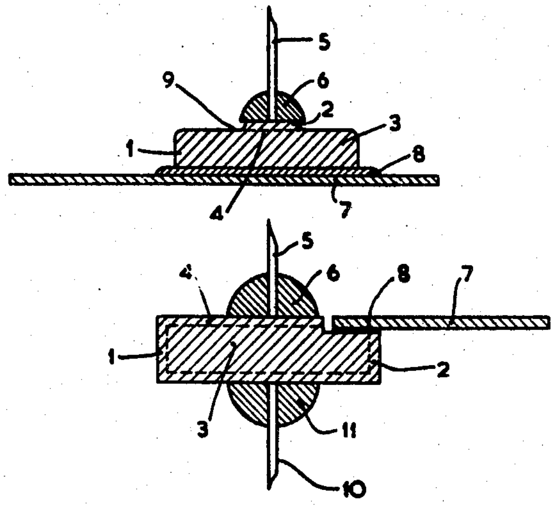
Figure 5:
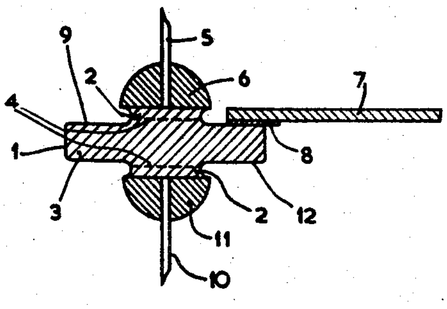

Two embodiments of semi-conductive devices according to the invention and a manner in which they may be manufactured will now be described by way of example, with reference to the accompanying diagrammatic drawing, in which:

Figures 1 and 2 show stages in the manufacture of a germanium diode shown in Figure 3, and Figures 1 and 4 show stages in the manufacture of a germanium transistor shown in Figure 5.

All the figures are sectional views.

Referring now to the drawing, Figure 1 shows a single crystal 1 of p-type germanium through the surface of which antimony has been diffused to provide a depth of n-type germanium 2, the interior 3 of the crystal remaining p-type so that a junction 4 is provided below the surface of the crystal.

Any known method may be used for providing the diffused n-type region, for example antimony may be diffused into the crystal 1 by heating the crystal 1 in an atmosphere of antimony vapour to provide the desired depth of diffusion and hence the desired depth of the junction 4 below the surface of the crystal 1.

The lower surface (as shown in Figure 1) of the crystal 1 is then ground away with the aid of fine abrasive and contacts are soldered to the surface of the crystal 1 as shown in Figure 2. In particular, a nickel electrode 7 covering the ground face of the crystal 1 is soldered to the crystal 1 with the aid of tin-gallium (99%—1%) solder 8 by heating to about 450° C. in a furnace in an atmosphere of hydrogen.

A nickel wire 5 is then soldered to the top surface of the crystal 1 with the use of tin-antimony (90%—10%) solder 6 and a flux, heat being applied by means of a stream of hot mixed gas ($N_2$:$H_2$::9:1) at a temperature of about 300° C. The resultant contact to the n-type region 2 is ohmic by reason of the donor impurity antimony.

The crystal 1 with its affixed contacts is then etched in a hydrogen peroxide bath (20 vols.) at 70° C. with the result that while the solder contacts are substantially not affected, the germanium of the crystal 1 is etched away. Etching is continued until only that part of the n-type layer 2 which is protected from the action of the bath by the overlying solder 6 remains, and the remaining part of the layer 2 and the remaining part of the junction 4 associated with the remaining part of the layer 2 stand out from the adjacent level 9 of the remaining p-type region.

The diode may contain in addition an impurity for reducing the dependency on temperature of the reverse current across the junction as is described in a copending application, Serial No. 619,189, filed October 30, 1956. Thus, nickel may be diffused into the crystal at the same time as the antimony as described above. In this connection, the nickel diffuses into the crystal faster than does the antimony so that the nickel diffusion into the whole of the crystal may readily be effected while the antimony penetration is limited.

For manufacturing a transistor, a crystal 1 as shown in Figure 1 is taken and the diffused, surface near the right-hand end as shown in Figure 1 is ground to remove part of the surface n-type region.

Contacts are then soldered to the surface as shown in Figure 4 the same reference numerals indicating similar components in Figures 2, 3, 4 and 5. In this case, the contact 7, constituting a base contact, is displaced with reference to that shown in Figure 2 and an additional contact 10 is affixed to the crystal 1 with solder 11 opposite and similar to the contact 5 and solder 6. The solder contact 11 if it is to constitute the collector electrode may be made larger than the solder contact 6.

Etching is effected as described with reference to Figure 3 with the result that an n-p-n-transistor is provided, the solder 11 and the second remaining part of the junction 4 associated with the contact 10 and solder 11 also standing out from the adjacent level 12 of the remaining part of the p-type region.

What is claimed is:

1. A method of manufacturing a semi-conductive device, comprising diffusing a conductivity-determining impurity from the surface of and into a semi-conductive body of one conductivity type to produce therein a diffused region of the opposite conductivity type and a diffused p-n junction, applying an ohmic contact to a desired surface portion of the diffused region of opposite conductivity, which contacted surface portion has an area smaller than the area of the total surface of said diffused region, and subjecting the thus-formed body to an etching treatment with an etching solution which dissolves only the semi-conductive body but not the ohmic contact until all of the said diffused region except that portion directly underlying and protected by the ohmic contact has been removed.

2. A method of manufacturing a semi-conductive device, comprising vapor-diffusing a conductivity-determining impurity from the surface of and into a wafer-shaped semi-conductive body of one conductivity type to produce therein a diffused region of the opposite conductivity type and a diffused p-n junction, soldering an ohmic contact to a desired surface portion of the diffused region of opposite conductivity, which contacted surface portion has an area smaller than the area of the total surface of said diffused region, and subjecting the thus-formed body to an etching treatment with an etching solution which dissolves only the semi-conductive body but not the ohmic contact until all of the said diffused region except that portion directly underlying and protected by the ohmic contact has been removed.

3. A method as set forth in claim 2 wherein the impurity is diffused into the semi-conductive body over the entire surface of the semi-conductive body.

4. A method as set forth in claim 2 wherein, before the etching treatment, a portion of the diffused region is mechanically removed to expose semi-conductive material of said one conductivity type, and an ohmic contact is applied to the thus-exposed material.

5. A method of manufacturing a semi-conductive device, comprising diffusing a conductivity-determining impurity from the surface of and into a wafer-shaped semi-conductive body of one conductivity type to produce therein a diffused region of the opposite conductivity type and a diffused p-n junction, soldering a pair of ohmic contacts to opposed surface portions of the diffused region of opposite conductivity, which contacted surface portions have an area smaller than the area of the total surface of said diffusion region, and subjecting the thus-formed body to an etching treatment with an etching solution which dissolves only the semi-conductive body but not the ohmic contact until all of the said diffused region except the portions directly underlying and protected by the ohmic contacts has been removed, thereby to produce two spaced junctions in said body.

6. A method as set forth in claim 5 wherein an ohmic contact is applied to an exposed portion of said one conductivity type material.

References Cited in the file of this patent

UNITED STATES PATENTS

| | | |
|---|---|---|
| 2,689,930 | Hall | Sept. 21, 1954 |
| 2,780,569 | Hewlett | Feb. 5, 1957 |
| 2,789,068 | Maserjian | Apr. 16, 1957 |
| 2,794,846 | Fuller | June 4, 1957 |
| 2,802,159 | Stump | Aug. 6, 1957 |

UNITED STATES PATENT OFFICE

CERTIFICATE OF CORRECTION

Patent No. 2,878,147 March 17, 1959

Julian Robert Anthony Beale

It is hereby certified that error appears in the printed specification of the above numbered patent requiring correction and that the said Letters Patent should read as corrected below.

Column 2, line 30, strike out "diffused," and insert the same before "surface" in line 32; column 4, line 3, for "diffusion" read -- diffused --.

Signed and sealed this 14th day of July 1959.

(SEAL)
Attest:

KARL H. AXLINE
Attesting Officer

ROBERT C. WATSON
Commissioner of Patents